United States Patent [19]

Wai Yeung Liu

[11] Patent Number: 5,032,744
[45] Date of Patent: Jul. 16, 1991

[54] HIGH SPEED COMPARATOR WITH OFFSET CANCELLATION

[75] Inventor: Edward Wai Yeung Liu, Daly City, Calif.

[73] Assignee: VLSI Technology, Inc., San Jose, Calif.

[21] Appl. No.: 429,585

[22] Filed: Oct. 31, 1989

[51] Int. Cl.[5] .................... H03K 3/356; H03K 3/023
[52] U.S. Cl. .................................. 307/491; 307/494; 307/355; 307/530; 307/279
[58] Field of Search ............... 307/530, 355, 362, 491, 307/494, 279

[56] References Cited

U.S. PATENT DOCUMENTS

| | | | |
|---|---|---|---|
| 4,629,911 | 12/1986 | Bebernes et al. | 307/530 |
| 4,802,130 | 1/1989 | Soneda | 307/530 |
| 4,814,642 | 3/1989 | Kleks | 307/530 |
| 4,858,195 | 8/1989 | Soneda | 307/530 |

OTHER PUBLICATIONS

Wu and Wooley, "A 100-MHz Pipelined CMOS Comparator", IEEE Journ. of Solid-State Circuits, vol. 26, 23:1379-1385 (Dec. 1988).
McCreary and Gray, "All-MOS Charge Redistribution Analog-to-Digital Conversion . . . ", IEEE Journ. of Sol.-Sta. Circuits, V.SC-10, pp. 371-379, No. 6, Dec. 1975.
Yee, Terman and Heller, "A 1 mV MOS Comparator", IEEE Journ. of Solid-State Circuits, V1., SC-13, No. 3, pp. 294-297 (Jun. 1978).
Poujois and Borel, "A Low Drift Fully Integrated MOSFET Operational Amplifier", IEEE Journ. of Solid-State Circuits, V1., SC-13, pp. 499-503.
Yukawa, "A CMOS 8-Bit High Speed A/D Converter IC", IEEE Journ. of Solid-State Circuits, V., SC-20, No. 3, pp. 775-779 (Jun. 1985).
Lee, Hodges and Gray, "A Self-Calibrating 15 Bit CMOS A/D, Converter", IEEE Journ. of Solid-State Circuits, V.SC-19, No. 6, pp. 813-819.

*Primary Examiner*—John Zazworsky
*Attorney, Agent, or Firm*—Majestic, Parson, Siebert & Hsue

[57] ABSTRACT

A regenerative latch includes a fully differential amplifier with two inputs and two outputs and two positive feedback paths, each path coupling each of the two outputs to one of the two inputs through a capacitor. Hence, during the reset phase, the two capacitors will block all DC voltages thereby enabling offset cancellation of the amplifier. During the regeneration phase, the two positive feedback paths drive the amplifier quickly into saturation. The output of the regenerative latch may be used to drive a second stage latch to reduce metastability and to reduce the gain requirements for the latch. The transistor channels of the input transistors of the second stage latch are reverse biased into depletion regions to reduce the input capacitance of the second latch during reset. Such low input capacitance speeds up the regeneration of the first stage latch.

21 Claims, 5 Drawing Sheets

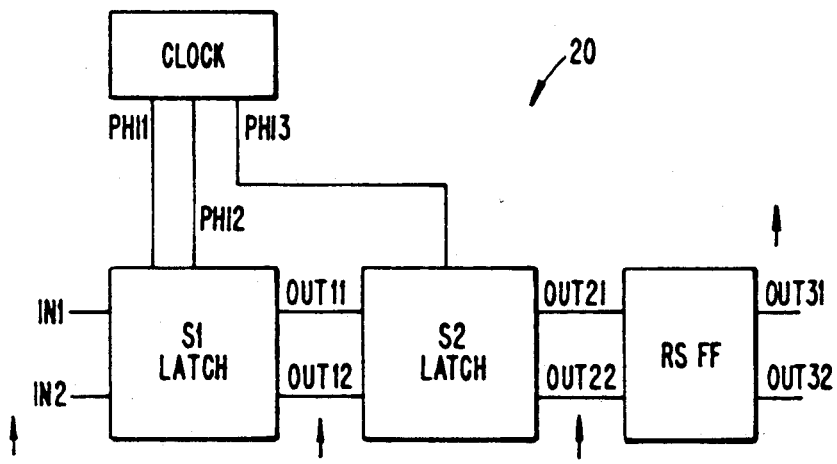
FIG._1A.
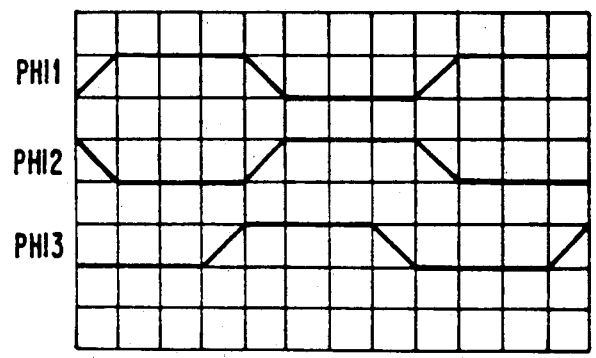
FIG._1B.
FIG._1C.
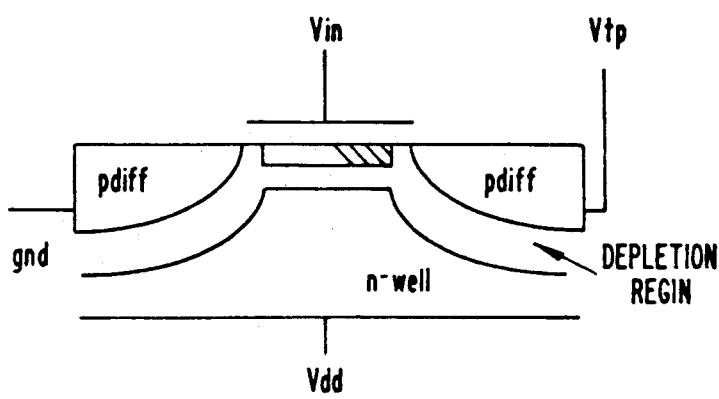
FIG._8A.
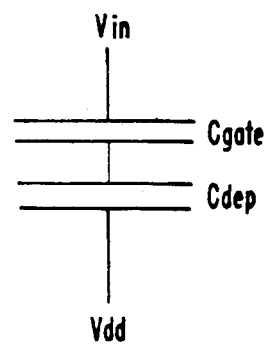
FIG._8B.

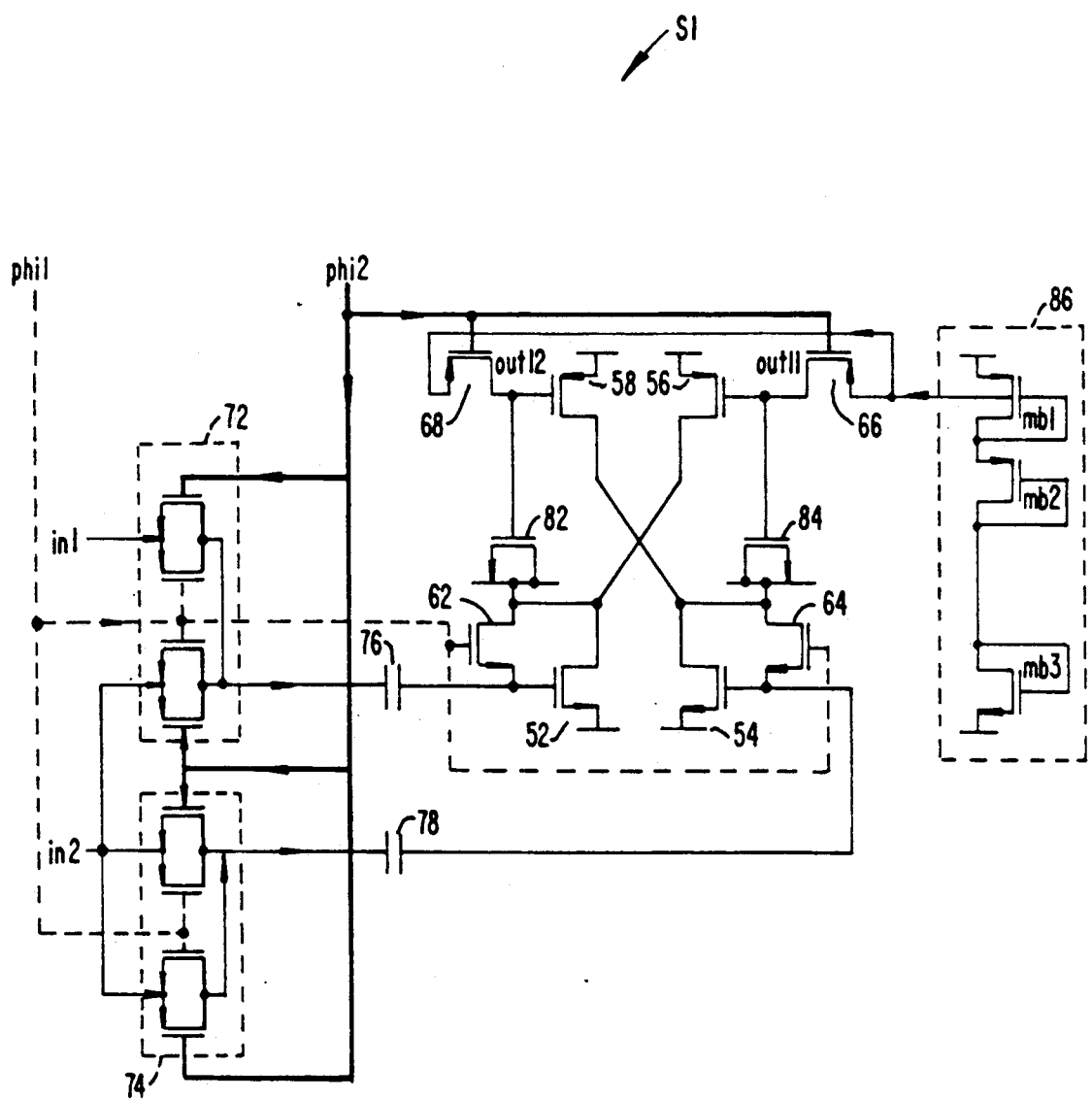
FIG._2.

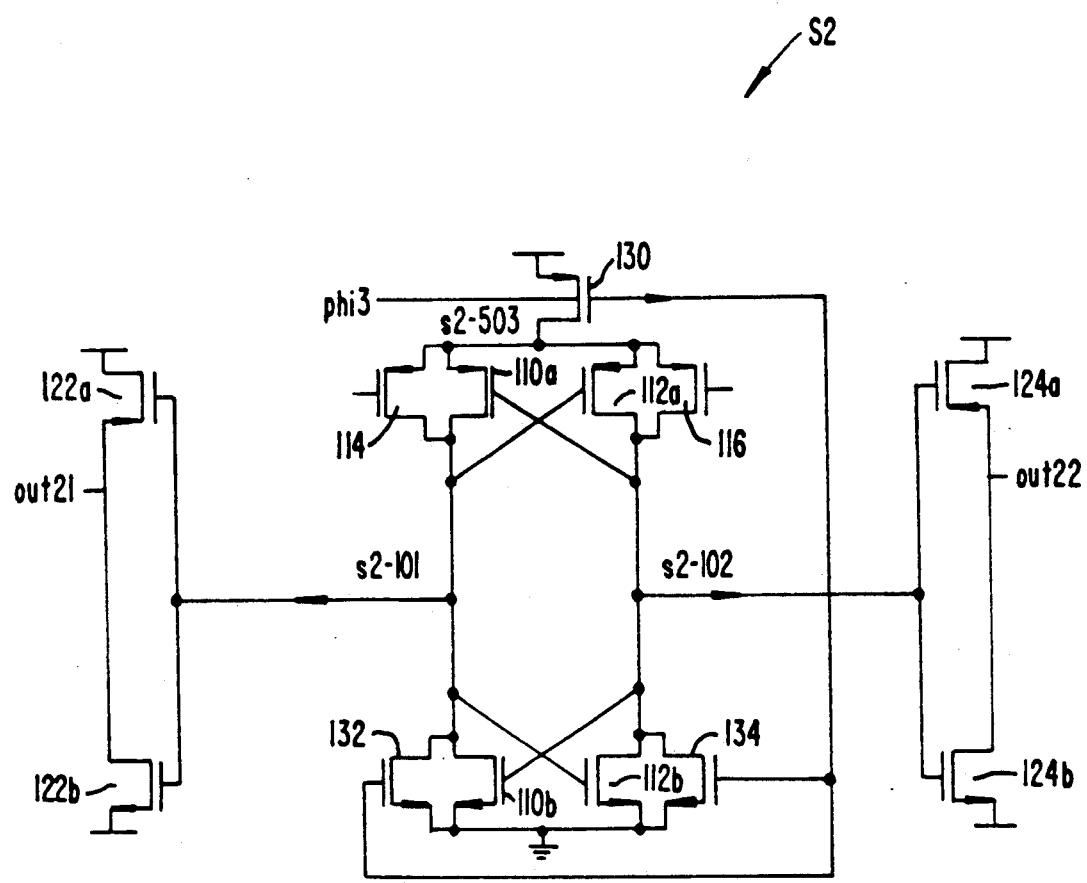
FIG._3.
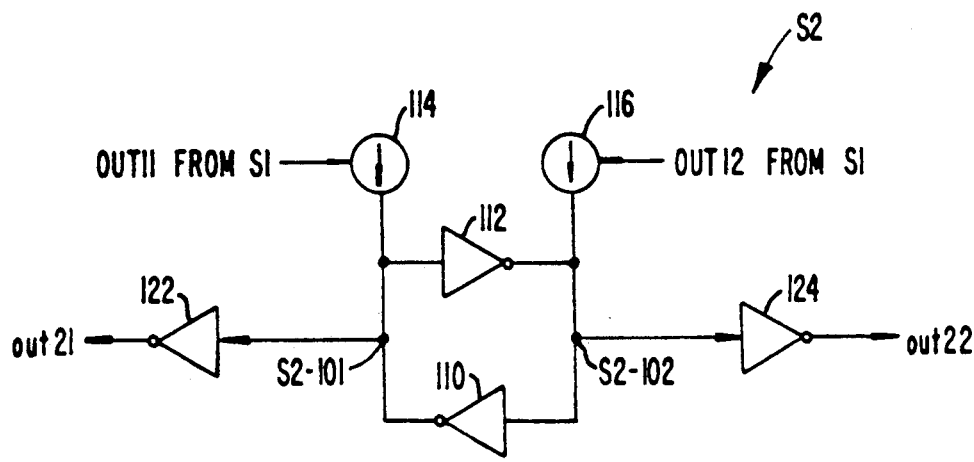
FIG._5.

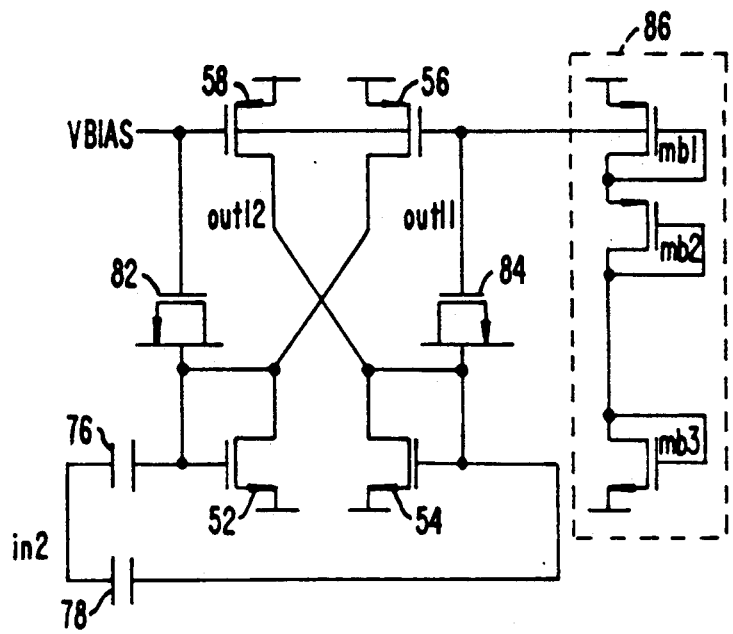
FIG._4A.
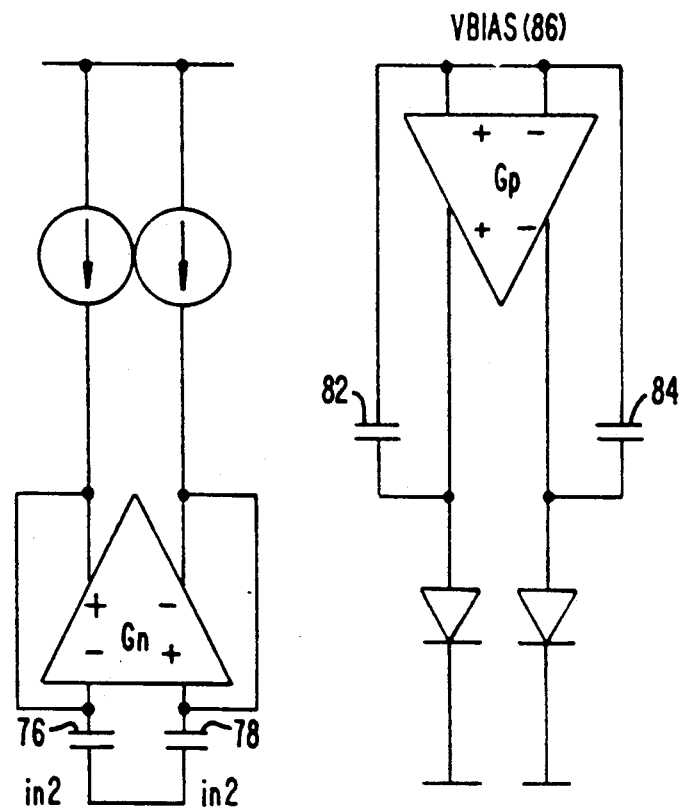
FIG._4B.  FIG._4C.

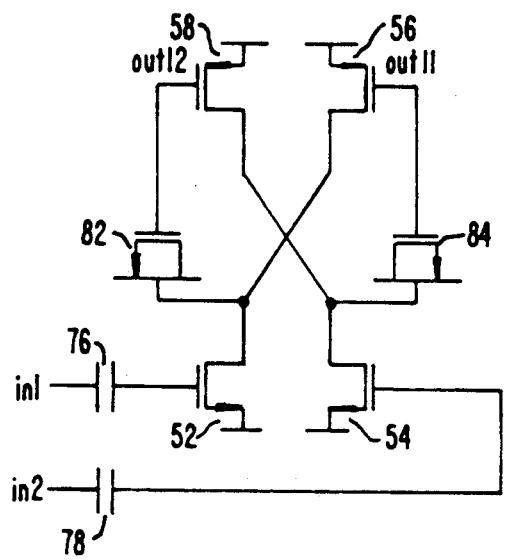
FIG._6.
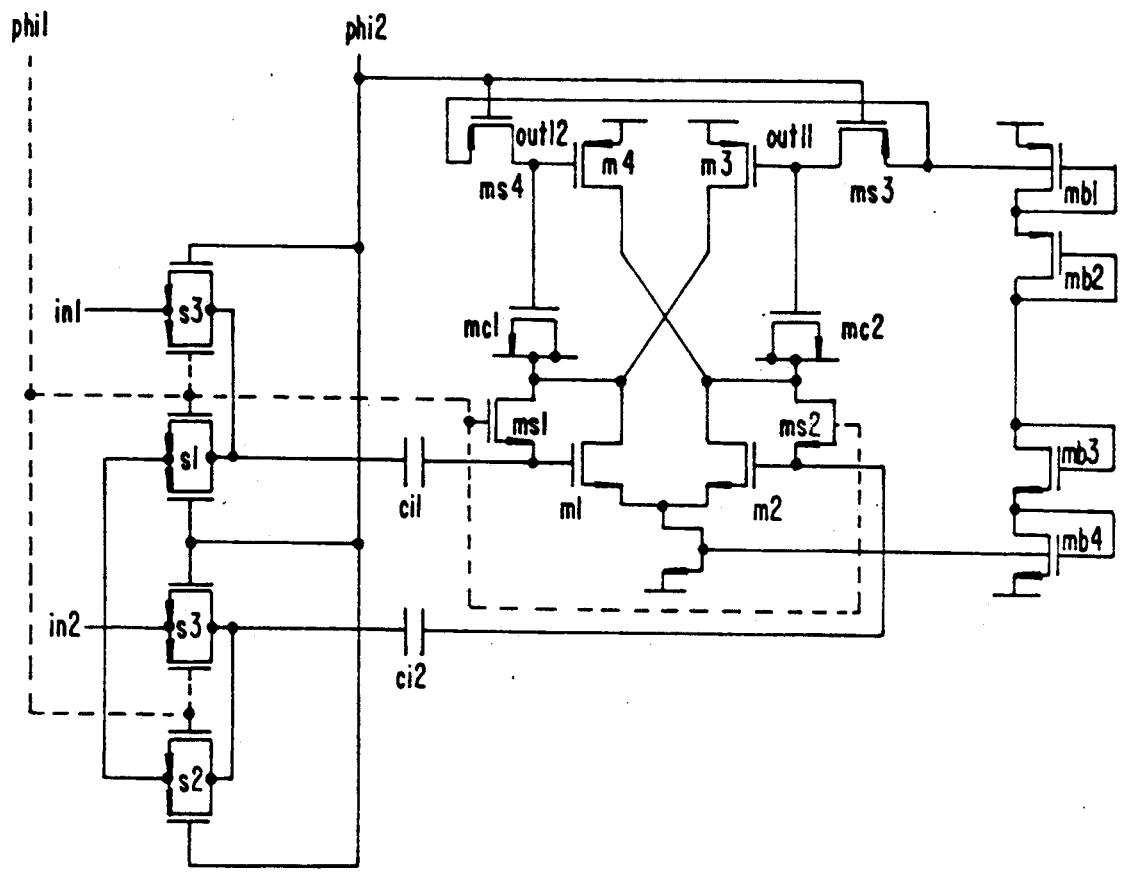
FIG._7.

HIGH SPEED COMPARATOR WITH OFFSET CANCELLATION

BACKGROUND OF THE INVENTION

This invention relates in general to comparators and in particular to a high-speed comparator comprising a regenerative latch with offset cancellation.

In the application specific integrated circuit (ASIC) industry, it is desirable to integrate an entire system or subsystem on one integrated circuit chip. The ability to so integrate increases the economy and reliability of the system or subsystem. However, to take advantage of this integration, all the system components are preferably implemented in the same process technology. Such integration becomes a significant problem, for example, in the case of mixed analog and digital systems. One way to integrate mixed analog and digital systems on one chip is to employ a special process technology for the analog systems in addition to the process technology for the digital portion of the chip. For most ASIC chips, only a small portion of the chip is used for analog circuits while by far the greater portion of the chip is used for digital circuits. Hence, devoting a special process technology for adding analog process modules in the digital process, such as capacitor implants and double poly, is expensive. One solution to the problem is to design certain analog components in the digital process. In this approach, careful circuit design is necessary to overcome the large offset voltages, and unpredictable amplification and lack of a good capacitor in a typical digital technology.

The comparator is a frequently used analog circuit on ASIC chips; for example, it is used in analog to digital converters. Therefore, it is desireable to provide a comparator circuit design which is feasible for implementation in a typical digital technology.

One conventional comparator proposed for implementation by a digital process employs wide band amplifiers where the differential signal between an input signal and a reference signal is linearly amplified to digital signal level using an open loop op-amp. The wide band amplifier may be implemented by means of a high gain stage or a cascade of low gain stages. Where a single high gain stage is used, the offset voltage and switch noise may be significant. Where a cascade of low gain stages is used, conversion time, power consumption and area are all increased. Furthermore, interfacing the stages may be problematic since the big coupling capacitors between the stages need a long time to charge up during reset, and they are difficult to implement with gate capacitance in a digital process.

In order to reduce the gain required, another conventional approach employs a latch following a set of wide band amplifiers. This approach inherits all of the advantages and disadvantages of the previously described wide band amplifier design, except that the gain required is significantly reduced.

To avoid the problem of implementing wide band amplifiers, another approach is to use only regeneration latches. For high resolution the latches must be offset cancelled. One such approach is described by Jieh-Tsorng Wu and Bruce A. Wooley in the article "A 100-MHz Pipelined CMOS Comparator", IEEE Journal of Solid-State Circuits, vol. 23, no. 6, December 1988, pp. 1,379-85. The latch described by Wu and Wooley has low resolution due to incorrect implementation of offset cancellation techniques. Therefore, such latch may be inadequate for certain applications. Furthermore, as explained in detail below, the operating point of the latch during the regeneration phase is slightly different from that during the reset phase due to clock feedthrough. Hence, even though the offset voltage has been cancelled during the reset phase, the offset voltage is no longer cancelled during the regeneration phase.

The above-described approaches for the comparator are not entirely satisfactory. It is therefore desireable to provide a comparator where the above-described difficulties are alleviated.

SUMMARY OF THE INVENTION

In order to offset cancel a regenerative latch, the positive feedback path must be broken during the reset phase, which means the path must vanish for DC signals. One approach is to break the path using a transistor switched by the clock. Another approach is by adding a negative feedback path switched by the clock. This is the approach adopted by Wu and Wooley in the article referenced above. As mentioned above, this approach usually shifts the bias of the circuit during the switch from the reset to the regeneration phase, since the feedback is direct. Therefore, the efforts in offset cancellation during the reset phase may be fruitless during the regeneration phase.

This invention adopts a different approach to offset cancel a regenerative latch. In this different approach the positive feedback path is blocked during the reset phase, not by breaking the path or by adding a negative feedback path using a switch, but by means of a capacitor with no negative feedback being switched on during the reset phase. Therefore, even though no signal path has been broken, the capacitor still blocks any DC signals. This approach preserves the bias conditions established during the reset phase so that the same offset-cancelled bias conditions persist during the regeneration phase. Thus, the offset cancellation accomplished during the reset phase is still effective during the regeneration phase.

The preferred embodiment of the latch of this invention includes an input stage and an output regenerative stage. During the reset phase, a substantially fixed bias is applied to the output stage to hold it down and to reduce or eliminate AC signal feedthrough. The substantially fixed bias also sets up the output stage for offset cancellation.

One aspect of the invention is directed towards a regenerative latch which comprises a fully differential amplifier with a first and a second input and a first and second output. The amplifier has a reset phase and a regenerative phase. The latch further comprises a first feedback path coupling the first output to the first input through a first capacitive means and a second feedback path coupling the second output to the second input through a second capacitive means. The two paths are positive feedback paths, each including a capacitive means. During the reset phase the two capacitive means will block all DC voltages, thereby enabling offset cancellation of the amplifier and, during the regeneration phase, the two positive feedback paths drive the amplifier quickly into saturation. The positive feedback enables the latch to operate at high speed.

According to another aspect of the invention, a second regenerative latch is added to the above-described regenerative latch, where the second regenerative latch generates a digital output from the output of the first latch. Addition of a second latch reduces metastability and increases the overall gain. The latches together form a pipelined comparator. The second latch is designed to reduce its input capacitance.

BRIEF DESCRIPTION OF THE DRAWINGS

FIG. 1A is a block diagram of a comparator to illustrate the preferred embodiment of the invention.

FIG. 1B is a timing diagram of clock signals for operating the system of FIG. 1A.

FIG. 1C is a schematic diagram illustrating the relative timing of the reset and regeneration phases of the two latches in FIG. 1A.

FIG. 2 is a schematic circuit diagram of the regenerative latch s1 of FIG. 1A.

FIG. 3 is a schematic circuit diagram of one implementation of the regenerative latch s2 of FIGS. 1A and 5.

FIG. 4A is a schematic circuit diagram illustrating the reset phase of the latch of FIG. 2.

FIGS. 4B, 4C are schematic circuit diagrams to illustrate offset cancellation for latch s1 of FIG. 2.

FIG. 5 is a schematic circuit diagram illustrating one embodiment of the latch s2 of FIG. 1A.

FIG. 6 is a schematic circuit diagram for illustrating the regeneration phase of the latch s1 of FIG. 2.

FIG. 7 is a schematic circuit diagram of a latch illustrating an alternative embodiment for the latch s1 of FIG. 1A.

FIG. 8A is a cross-sectional view of an input transistor of the latch s2 of FIG. 1A during the reset phase to illustrate the preferred embodiment of the invention.

FIG. 8B is a schematic circuit diagram to illustrate the operation of the input transistor of FIG. 8A.

DETAILED DESCRIPTION OF THE INVENTION

FIG. 1A is a block diagram of a comparator to illustrate the preferred embodiment of the invention. Comparator 20 includes two regenerative latches s1, s2 and a RS flip-flop. The two analog inputs in1, in2 are applied to the first latch s1 which amplifies the difference between the two input signals and provides two output signals out11, out12. The difference between the two output signals out11, out12 is again amplified by a second latch s2 to provide two outputs out21 and out22 which are substantially at digital signal levels. The two output signals of s2 are recorded by the RS flip-flop which provides outputs out31, out32.

FIG. 1B is a timing diagram of the three clock signals phi1-phi3 supplied to the two latches s1, s2 and FIG. 1C is a schematic diagram of the reset and regeneration phases of latches s1, 2, showing the relative timing of the two phases for the two latches, and in relation to the clock signals of FIG. 1B.

As is known to those skilled in the art, resetting one of the two latches will affect the regeneration of the other latch in a phenomenon known as kickback noise. By delaying the clock signal phi3 relative to phi1 and phi2, the reset phases of the two latches overlap for a time period t indicated in FIG. 1C. This permits the different nodes in comparator 20 to quiet down entirely.

FIG. 2 is a schematic circuit diagram illustrating a preferred implementation of the regenerative latch s1 of FIG. 1A. Regenerative latch s1 includes an input stage and an output stage, where the input stage includes transistors 52, 54 and the output stage includes transistors 56, 58. The four transistors are controlled by the two clock signals phi1, phi2 through four switches 62-68. The two inputs in1, in2 are coupled to the gates of transistors 52, 54 through multiplexers 72, 74 and capacitors 76, 78. The drains of transistors 52, 54 are connected in feed back paths to the gates of transistors 56, 58 through transistors 82, 84 which function essentially as capacitors. Transistors 56, 58 are biased by a bias means 86.

As shown in FIGS. 1B and 1C, during the reset phase of s1, the clock signal phi1 is high and the clock signal phi2 is low. Multiplexers 72, 74 therefore block input signal in1 and applies input signal in2 to the gates of transistors 52, 54 through capacitors 76, 78. Switches 62-68 are all turned on so that the circuit of FIG. 2 reduces to that in FIG. 4A. FIGS. 4B, 4C are different ways of looking at the circuit of FIG. 4A to show the offset cancellation schemes for the nmos pair 52, 54 and pmos pair 56, 58 respectively.

FIG. 4B illustrates how the nmos pair 52, 54 is put into an autozero configuration, while its offset voltage is being stored on capacitors 76, 78. As viewed from the pair 52, 54, current is supplied to the pair from a pair of current sources. The offset voltage of the pair is compressed. The pair is therefore offset cancelled to the first order of approximation. To offset cancel the pair in order to put the pair in an autozero configuration, the gate voltages are different by $V_{os}$ and such different gate voltages are stored on capacitors 76, 78.

FIG. 4C shows how the pmos pair 56, 58 is offset cancelled by the bias means 86. The offset voltage of the pair, corresponding to the intrinsic pmos offset voltage multiplied by the transconductance ratio of the pmos and nmos transistors will appear as the output at the bottom plates of the capacitors 82, 84. The offset voltage will therefore be stored at the two capacitors and cancelled entirely from the perspective of the pmos pair. This offset voltage stored on capacitors 82, 84 is directly deposited on the gates of transistors 52, 54. As a result, a gate voltage imbalance appears at transistors 52, 54 and the value of this voltage imbalance is given by:

$$V_{osn} = V_{os} \frac{g_{mp}}{g_{mn}}$$

where $V_{osn}$ is the voltage imbalance at transistors 52, 54, $V_{os}$ is the offset voltage of the four transistors 52–58, $g_{mp}$ is the transconductance of transistors 56, 58 in saturation, and $g_{mn}$ is the transconductance of transistors 52, 54 in saturation. This voltage imbalance, in turn, causes signal dependent charge injection as well as a current imbalance and a common mode gain mismatch given by:

$$\Delta g_{mn} = \frac{V_{osn}}{V_{gsn} - V_{TN}} g_{mn} = \frac{V_{os} \frac{g_{mp}}{g_{mn}}}{V_{gsn} - V_{TN}} g_{mn}$$

where $\Delta g_{mn}$ is the common mode gain mismatch, $V_{gsn}$ is the gate to source voltage of the NMOS transistors 52, 54 and $V_{TN}$ is the threshhold voltage of the NMOS transistors 52, 54. This is the main limitation to high resolution. When a common mode signal $V_{cm}$ is applied to the gates of transistors 52, 54, the equivalent error is defined as:

$$V_{error} = \frac{\Delta g_{mn}}{g_{mn}} V_{cm} = V_{os} \frac{g_{mp}}{g_{mn}} \cdot \frac{V_{cm}}{V_{gsn} - V_{TN}}$$

Assuming $(V_{cm}/[V_{gsn} - V_{TN}]) \leq 1$, the worst case error is thus given by $$V_{error} \leq V_{os} \frac{g_{mp}}{g_{mn}}.$$

To cancel the signal dependent charge injection, in applying the clock signals to latch s1 in FIG. 2 to reset the latch, switches 62, 64 should be opened before switches 66 and 68. In this manner the charge injection mismatch of switches 62, 64 is amplified by transistors 52, 54 and stored on capacitors 82, 84. However, this cancellation technique is only attractive for low speed applications in which the available regeneration time is much larger than the recovery time of the latch and where very high resolution is desired. In the above description, the bias means 86 applies substantially the same voltage to the gates of transistors 56, 58 during the reset phase in order to cancel the effects of the input stage (transistors 52, 54).

In the design of FIG. 2 and the design by Wu and Wooley, the positive feedback paths are each broken by a DC blocking capacitor. However, in both designs, there remains the issue of AC signal propagating through the DC blocking capacitor. In other words, if nothing is holding down the output regenerative stage (transistors 56, 58 of FIG. 2), AC signals can propagate through the positive feedback path, making offset cancellation impossible and greatly increasing the settling time, thereby slowing the comparator. To prevent this, in the design by Wu and Wooley, a negative feedback path is added during the reset phase by closing a switch to clamp the output stage amplifier so as to suppress entirely the AC signals. However, by using a negative feedback path to clamp the output stage amplifier through the closing of a switch, Wu and Wooley introduce two problems, namely that the offset cancellation would not work due to the reduction of open loop gain of the output stage, and that the negative feedback clamp introduces much noise when the switch opens. In contrast, in the embodiment of the invention illustrated in FIG. 2, the output stage comprising transistors 56, 58 are held down by an external voltage source Vbias means 86. Since the voltage applied by source 86 is substantially fixed, the voltage at the input gates of transistors 56, 58 are also fixed to clamp the output stage amplifier. Therefore, AC signals will simply be suppressed entirely. Another function of the fixed voltage applied by source 86 is to set up the regenerative output stage for output offset cancellation in a manner described above. The advantages of the FIG. 2 design is that the offset of the output regenerative stage is cancelled entirely and that capacitors 82, 84 are well-equipped to store the voltage of the output stage.

As described above, the nmos pair 52, 54 and the pmos pair 56, 58 are both offset cancelled where the offset voltages are stored on capacitors 76, 78, 82, 84. Hence the fully differential amplifier comprising transistors 52-58 is balanced at the end of the reset phase. In reference to FIGS. 1B and 1C upon entering the regeneration phase of s1, the clock signal phi1 falls low and the clock signal phi2 goes high. This causes switches 62-68 to be opened. Multiplexers 72, 74 cause the input in1 to be applied to the gate of transistor 52 through capacitor 76 and input in2 to be applied to the gate of transistor 54 through capacitor 78. Latch s1 therefore reduces to the simplified configuration in FIG. 6 during the regeneration phase.

As shown in FIG. 6, transistors 52-58 form a fully differential amplifier with two positive feedback paths. In one path, the input in1 is coupled by means of transistor 82 (acting as a capacitor) to the output out12. In the second path, the input in2 is coupled through transistor 84 (functioning as a capacitor) to the output out11. Therefore, any imbalance between the two inputs will be quickly amplified by the differential amplifier in s1 and appears at the outputs. Since the feedback paths are coupled through capacitor means 82, 84, DC signals are therefore blocked. Furthermore, by using capacitors instead of switches in the feedback paths, the operating point of the latch s1 does not change when the operating mode of the latch shifts from reset to regeneration so that the offset cancellation accomplished during the reset stage is still valid and applies during regeneration. In this respect, the latch s1 described above is very different from that disclosed by Wu and Wooley in the article described above.

Regeneration bandwidth of latch s1 defines how fast the latch reaches saturation. The regeneration bandwidth is given by $$\text{Regeneration Bandwidth} = \frac{g_{mp}}{C_{gate}} = \frac{g_{mn}}{g_{mn}} \cdot \frac{g_{mp}}{C_{gate}}$$

where $C_{gate}$ is the gate capacitance of each of the NMOS transistors 52, 54. Since $$\frac{V_{error}}{V_{os}} \leq \frac{g_{mp}}{g_{mn}},$$

this expression reduces to $$\text{Regeneration Bandwidth} \leq \frac{V_{error}}{V_{os}} \cdot \frac{g_{mn}}{C_{gate}}$$

Defining $V_{error}/V_{os}$ as the offset compression ratio and $g_{mn}/C_{gate}$ as the input stage bandwidth, the regeneration bandwidth is thus given by the offset compression ratio times the input stage bandwidth. Therefore, compression of offset voltage directly reduces the speed of the latch in reaching saturation. Furthermore, nmos should be chosen over pmos for the input stage because of the higher bandwidth of the nmos transistors. Therefore, transistors 52, 54 are preferably nmos instead of pmos transistors.

The stage s2 will now be described in reference to FIGS. 3 and 5. If only one latch s1 is used for the comparator, sometimes latch s1 remains balanced despite a small difference in voltage between the input to the latch where the latch is said to be metastable. Latch s2 is employed as shown in FIG. to reduce metastability. As shown in FIG. 5, latch s2 comprises two inverters 110, 112, where the output of each inverter is fed to the input of the other inverter at nodes s2-101, s2-102. The two inverters are driven by current sources 114, 116 supplied to the two nodes where the currents supplied by the two current sources are functions of the inputs from latch s1. The outputs out11, out12 from latch s1 are fed to the current sources 114, 116 of s2 as shown in FIG. 5. Therefore, any difference between the outputs of latch s1 will be amplified by s2 and provided as outputs out21, out22 through inverters 122, 124.

One implementation of latch s2 of FIG. 5 is shown in FIG. 3. As shown in FIG. 3, inverter 112 of FIG. 5 includes transistors 112a, 112b and inverter 110 of FIG. 5 comprises transistors 110a, 110b of FIG. 3. Current sources 114, 116 each comprises a transistor where the output signals out11, out12 from s1 are applied to the gates of two transistors as shown in FIG. 3. Inverter 122 includes transistors 122a, 122b and inverter 124 includes transistors 124a, 124b as shown in FIG. 3. The sources of transistors 110a, 112a, 114, 116 are connected to the drain of a transistor 130 at node s2-503. Transistors 132, 134 acting as switches together with transistor 130 are controlled by the clock signal phi3.

To conserve power, no output buffer is included in latch s1 and the outputs of latch s1 directly drive the input transistors (110a, 112a) of s2. It is therefore desirable for latch s2 to have low input capacitance to minimize the slowing down of the regeneration of latch s1. This is achieved by the circuit design shown in FIG. 3.

During the reset phase of latch s2 as shown in FIGS. 1B, 1C, the clock signal phi3 is high. Therefore, transistor 130 is off and transistors 132, 134 are turned on. Therefore, nodes s2-101, s2-102 are pulled to ground and node s2-503 is pulled to a voltage level which is at most one threshold voltage above ground, where the threshold voltage Vtp is that of the p-type transistor (110a, 112a, 114, 116). Consequently, the source and drain junctions of the input transistors 110a, 112a are both reverse biased, so that no carriers will be supplied to the channel in the two input transistors. This is illustrated in more detail in FIGS. 8A, 8B.

FIG. 8A is a cross-sectional view of transistor 110a, 112a. As shown in FIG. 8A, the drain regions of the two input transistors are connected to ground through nodes s2-101, s2-102. The source regions are each at most at a voltage level which is above ground by the threshold voltage of transistors 110a, 112a. Therefore, both the drain and source regions of the two input transistors 110a, 112a are below that of the n substrate so that the channel of both transistors will be depletion regions with no carriers. Each of the two input transistors 110a, 112a, in such circumstances, will be equivalent to two capacitors connected in series as shown in FIG. 8B, where one capacitor has the capacitance of the gate of the transistors and the other capacitor has the capacitance formed by the depletion region and the n substrate. The combined capacitance of the two capacitors in series as shown in FIG. 8B is lower than the capacitance of the gate of each of the transistors. This therefore lowers the input capacitance of latch s2.

From FIG. 1C, latch s1 is in the regeneration phase while latch s2 is being reset. Therefore, the input capacitance of latch s2 is reduced while latch s1 is being regenerated; this low input capacitance of s2 will therefore speed s1 regeneration.

In reference to FIG. 1C, during the regeneration phase of latch s2, the clock signal phi3 is low so that transistor 130 is turned on and transistors 132, 134 are turned off. Therefore, node s2-503 is charged to a rail voltage (5 V, for example) and nodes s2-101, s2-102 will diverge to complementary digital levels whose polarity depend on the input signals applied to the gates of transistors 114, 116. In other words, latch s2 rapidly amplifies the difference between the input signals applied to the gates of transistors 114, 116 to provide two output signals out21, out22 at complementary digital levels whose polarity depends on the polarity of the input signals to s2.

The above-described circuit design of latch s2 is an improvement over the latch described by Yukawa in the article "A CMOS 8-Bit High-Speed A/D Converter IC," IEEE Journal of Solid-State circuits, Volume SC-20, No. 3, pages 775–779, June 1985. In the latch described by Yukawa, the input transistors are connected to the outputs of the latch through switches which are broken during the reset phase. The transistor channels of the input transistors exist during the reset phase, so that the input capacitance in the latch described by Yukawa is not reduced during the reset phase. Thus, in the latch described by Yukawa, the latch is reset by breaking the feedback path through the switches. In the circuit design of FIG. 3, the feedback is not broken; instead, the power supplied to the latch is cut off during reset to reduce its input capacitance.

FIG. 7 is a schematic circuit diagram of a latch to illustrate an alternative embodiment for latch s1 of FIG. 1A. The circuit of FIG. 7 differs from that of FIG. 2 in that the circuit of FIG. 7 requires a wider range of supplied voltage compared to that of FIG. 2. For simplicity in understanding, identical components in the figures are labelled by the same numerals.

While the invention has been described by reference to particular implementations and circuit designs, it will be understood that various modifications may be made without departing from the scope of the invention which is to be limited only by the appended claims.

What is claimed is:

1. A regenerative latch comprising:
   a fully differential amplifier with a first and a second input and a first and a second output, said amplifier being in a reset operational phase and in a regenerative operational phase;
   a first feedback path coupling the first output to the first input through a first capacitive means, and
   a second feedback path coupling the second output to the second input through a second capacitive means, said two paths being positive feedback paths so that during the reset phase, the two capacitive means will block all D.C. voltages thereby enabling offset cancellation of the amplifier, and so that during the regeneration phase, the two positive feedback paths drive the amplifier into saturation.

2. The latch of claim 1, wherein said amplifier has an input stage and an output regenerative stage, said latch further comprising means for applying a substantially fixed bias to the output stage during the reset phase for clamping down the output stage and for accomplishing offset cancellation.

3. The latch of claim 2, wherein said output stage comprises two MOSFETs, and wherein said substantially fixed bias applying means applies bias to the gates of the MOSFETs.

4. The latch of claim 2, said latch having an offset compression ratio and an input stage bandwidth.

5. The latch of claim 4, wherein the latch has a regeneration bandwidth which is given by the product of the offset compression ratio and the input stage bandwidth.

6. The latch of claim 2, wherein the input stage comprises a pair of nmos transistors.

7. The latch of claim 2, wherein the output regenerative stage comprises a pair of pmos transistors.

8. The latch of claim 7, further comprising means for applying substantially the same voltage to the gates of the pair of pmos transistors during the reset phase in order to cancel the offsets of the input stage.

9. The latch of claim 7, wherein the input stage comprises a pair of nmos transistors, and the output regenerative stage comprises a pair of pmos transistors, wherein the four transistors have offset voltage Vos, the nmos transistors have transconductance $g_{mn}$ in saturation and the pmos transistors have transconductance $g_{mp}$ in saturation, and wherein the latch has a resolution where worst case error is given by $Vos(g_{mp}/g_{mn})$.

10. A pipelined comparator comprising:
   (a) a first regenerative latch which comprises:
      a fully differential amplifier with a first and a second input and a first and a second output, a reset operational phase and a regenerative operational phase;
      a first feedback path coupling the first output to the first input through a first capacitive means, and a second feedback path coupling the second output to the second input through a second capacitive means, said two paths being positive feedback paths so that during the reset phase, the two capacitive means will block all D.C. voltages thereby enabling offset cancellation of the amplifier, and so that during the regeneration phase, the two positive feedback paths drive the amplifier into saturation; and
   (b) a second regenerative latch connected to said first and second outputs of said first latch for generating a digital output from the outputs of the first latch.

11. The comparator of claim 10, wherein said second latch comprises:
   a first and a second inverter, wherein the output of each inverter is fed back to the input of the other inverter;
   a first current source for supplying current to the input of the first inverter, said first current source supplying a current substantially proportional to the first output of the amplifier in the first latch; and
   a second current source for supplying current to the input of the second inverter, said second current source supplying a current substantially proportional to the second output of the amplifier in the first latch, so that the second latch is directly driven by the first latch;
   wherein one of the two outputs of the two inverters provides the digital output of the comparator.

12. The comparator of claim 11, wherein each inverter includes a power supply means for supplying power to the inverter, wherein said second latch has a reset operational phase and a regenerative operational phase, said comparator further comprising switch means for switching off the power supply means to the inverters during the reset phase of the second latch without switching off the feedback of the output of each inverter to the input of the other inverter to reduce the input capacitance of the second latch and the load on the first latch during the regeneration phase of the first latch.

13. The comparator of claim 11, further comprising a third and a fourth inverter responsive respectively to the outputs of the first and second inverter for driving the output of the comparator.

14. The comparator of claim 10, wherein said fully differential amplifier has an input stage and an output regenerative stage, said first latch further comprising means for applying a substantially fixed bias to the output stage during the reset phase for clamping down the output stage and for accomplishing offset cancellation.

15. The comparator of claim 14, wherein said output stage comprises two MOSFETs, and wherein said substantially fixed bias applying means applies bias to the gates of the MOSFETs.

16. The comparator of claim 14, said first latch having an offset compression ratio and an input stage bandwidth.

17. The comparator of claim 16, wherein the first latch has a regeneration bandwidth which is given by the product of the offset compression ratio and the input stage bandwidth.

18. The comparator of claim 14, wherein the input stage comprises a pair of nmos transistors.

19. The comparator of claim 14, wherein the output regenerative stage comprises a pair of pmos transistors.

20. The comparator of claim 19, further comprising means for applying substantially the same voltage to the gates of the pair of pmos transistors during the reset phase in order to cancel the offsets of the input stage.

21. The comparator of claim 14, wherein the input stage comprises a pair of nmos transistors, and the output regenerative stage comprises a pair of pmos transistors, wherein the four transistors have offset voltage Vos, the nmos transistors have transconductance $g_{mn}$ in saturation and the pmos transistors have transconductance $g_{mp}$ in saturation, and wherein the first latch has a resolution where worst case error is given by $Vos(g_{mp}/g_{mn})$.

* * * * *